(12) United States Patent
Guerriero et al.

(10) Patent No.: US 10,892,623 B2
(45) Date of Patent: Jan. 12, 2021

(54) METHOD FOR DETECTING ISLANDING CONDITION FOR A DC/AC CONVERTER APPARATUS AND A DC/AC CONVERTER APPARATUS THEREOF

(71) Applicant: ABB Schweiz AG, Baden (CH)

(72) Inventors: Alessandro Guerriero, Paglieta (IT); Filippo Lalli, Loro Ciuffenna (IT); Silvio Scaletti, Civitella in Val di Chiana (IT); Tiberio Bucci, Lastra a Signa (IT)

(73) Assignee: ABB Schweiz AG, Baden (CH)

( * ) Notice: Subject to any disclaimer, the term of this patent is extended or adjusted under 35 U.S.C. 154(b) by 22 days.

(21) Appl. No.: 16/470,378

(22) PCT Filed: Dec. 15, 2016

(86) PCT No.: PCT/EP2016/081177
§ 371 (c)(1),
(2) Date: Jun. 17, 2019

(87) PCT Pub. No.: WO2018/108277
PCT Pub. Date: Jun. 21, 2018

(65) Prior Publication Data
US 2020/0127462 A1 Apr. 23, 2020

(51) Int. Cl.
*H02J 1/00* (2006.01)
*H02J 3/00* (2006.01)
(Continued)

(52) U.S. Cl.
CPC ......... *H02J 3/388* (2020.01); *G01R 19/2513* (2013.01); *G01R 31/42* (2013.01);
(Continued)

(58) Field of Classification Search
CPC ......... H01L 31/0583; H02J 3/32; H02J 3/382; H02J 9/061; H02J 1/08; H02J 2003/338; H02M 7/44
(Continued)

(56) References Cited

U.S. PATENT DOCUMENTS 8,258,759 B2 * 9/2012 Yin .................. H02J 3/383
322/19
9,941,814 B2 * 4/2018 Farese ................. G01R 19/175
10,211,721 B2 * 2/2019 Becattini ................ H02J 3/383

FOREIGN PATENT DOCUMENTS

EP 0810713 A2 12/1997
EP 1808947 A2 7/2007
(Continued)

OTHER PUBLICATIONS

European Patent Office, International Search Report & Written Opinion issued in corresponding Application No. PCT/EP2016/081177, dated Aug. 28, 2017, 14 pp.

*Primary Examiner* — Anh Q Tra
(74) *Attorney, Agent, or Firm* — Taft Stettinius & Hollister LLP; J. Bruce Schelkopf (57) ABSTRACT

A method for detecting an islanding condition of a grid connected energy conversion system and related DC/AC converter apparatus to optimize performance in terms of preservation of the power quality, provide synchronized frequency perturbation for all the inverters of a plant, provide shut down capability within the time requested by utilities and safety standards and provide immunity to grid frequency fluctuations.

20 Claims, 7 Drawing Sheets

(51) Int. Cl.
  *H02J 3/38* (2006.01)
  *G01R 19/25* (2006.01)
  *G01R 31/42* (2006.01)

(52) U.S. Cl.
  CPC ........... *H02J 3/381* (2013.01); *H02J 2300/24* (2020.01); *H02J 2300/28* (2020.01)

(58) Field of Classification Search
  USPC .......................................................... 307/72
  See application file for complete search history.

(56) References Cited

FOREIGN PATENT DOCUMENTS

EP          3079217 A1   10/2016
JP       2011055678 A    3/2011

* cited by examiner

METHOD FOR DETECTING ISLANDING CONDITION FOR A DC/AC CONVERTER APPARATUS AND A DC/AC CONVERTER APPARATUS THEREOF

The present invention relates to the field of electric power generation systems, especially of electric power generation systems including renewable sources, such as photovoltaic panels or wind turbines.

In particular, the present invention relates to an improved method for detecting islanding conditions for a DC/AC converter apparatus.

Electric power generation systems including renewable sources are typically designed to generate electrical power for direct delivery to a main grid, such as an electric power utility grid.

To this aim, an electric power generation system is generally equipped with one or more DC/AC converter apparatuses, each of which is adapted to convert DC electrical power generated by a respective electric power generation apparatus (e.g. a photovoltaic plant) into AC electric power to be delivered to the main grid.

Normally, the DC/AC converter apparatus of an electric power generation system is always electrically connected to the main grid.

However, in response to system needs or abnormal conditions (e.g. faults or power outages in the main grid), said apparatus may be electrically disconnected from the main grid but still working, operating in a so-called "islanded mode" and no more in "grid connected mode".

A DC/AC converter apparatus operating in islanded mode can be very dangerous, in particular to utility workers, who may not realize that an electric circuit is still powered as said apparatus is exchanging electric power with a resonant electric circuit electrically connected thereto.

For that reason, a DC/AC converter apparatus of an electric power generation system is typically provided with control means configured to implement a detection method to check whether it is operating in islanding conditions.

Several solutions to detect islanding conditions for a DC/AC converter apparatus have been proposed during the past years.

These solutions can be generally divided in passive and active detection methods.

Passive detection methods typically provide for monitoring given physical parameters (e.g. voltage and frequency, the grid voltage change rate or the grid frequency change rate) at a point of common coupling between the DC/AC converter apparatus and the main grid and preventing said DC/AC converter apparatus from supplying electric power to the main grid, if the detected parameters differ from given nominal or averaged values.

Active detection methods provide for introducing a controlled perturbation in the operation of the DC/AC converter apparatus and monitoring the responsive behavior of the AC voltage at the point of common coupling to determine whether said DC/AC converter apparatus is still connected to the main grid.

Known examples of said active detection methods are the so-called Sandia™-like frequency shift method and Sandia™-like voltage shift methods.

Active detection methods are generally preferred by manufacturers because they are characterized by narrower NDZs (Non Detection Zones) and faster detection times compared to passive detection methods.

EP3079217A1 discloses a method for detecting whether a grid connected DC/AC converter apparatus operates in islanded mode.

According to a disclosed embodiment, an initial frequency disturbance is provided to a reference signal that is normally processed to control the output voltage provided by the DC/AC converter apparatus while the frequency of the AC voltage at the point of common coupling with the main grid is monitored.

Depending on the behavior of the frequency of the AC voltage at the point of common coupling in response to said initial frequency disturbance, the operation of the DC/AC converter apparatus is immediately modified or further stronger frequency disturbances are applied to said reference signal to check whether islanding conditions are present.

According to this method, the mentioned initial frequency disturbance may consist in applying a frequency perturbation having a predefined frequency perturbation value with a positive sign for a first predefined number n of AC cycles and with a negative sign for a second predefined number m of AC cycles.

The above mentioned initial frequency perturbation is applied periodically for subsequent sequences of n+m AC cycles until a responsive frequency drift of the AC voltage at the point of common coupling is detected.

The method disclosed in the above mentioned document shows excellent results in detecting possible islanding conditions for a DC/AC converter apparatus.

However, in the state of the art there is still a need for solutions providing top level islanding detection performances, particularly when multiple DC/AC converter apparatuses are electrically connected at a same common coupling point.

The present invention intends to respond to this need by providing a method for detecting islanding conditions for a DC/AC converter apparatus, according to the following claim 1 and the related dependent claims.

In a further aspect, the present invention relates to a grid connectable DC/AC converter apparatus, according to the following claim 12.

In yet a further aspect, the present invention relates to an electric power generation system, according to the following claim 13.

Features and advantages of the present invention will be apparent in the following description of non-limitative embodiments with reference to the figures in the accompanying drawings, in which.

Referring to the cited figures, the present invention relates to a method 1 for detecting islanding conditions for a DC/AC converter apparatus 1.

Figure 1:
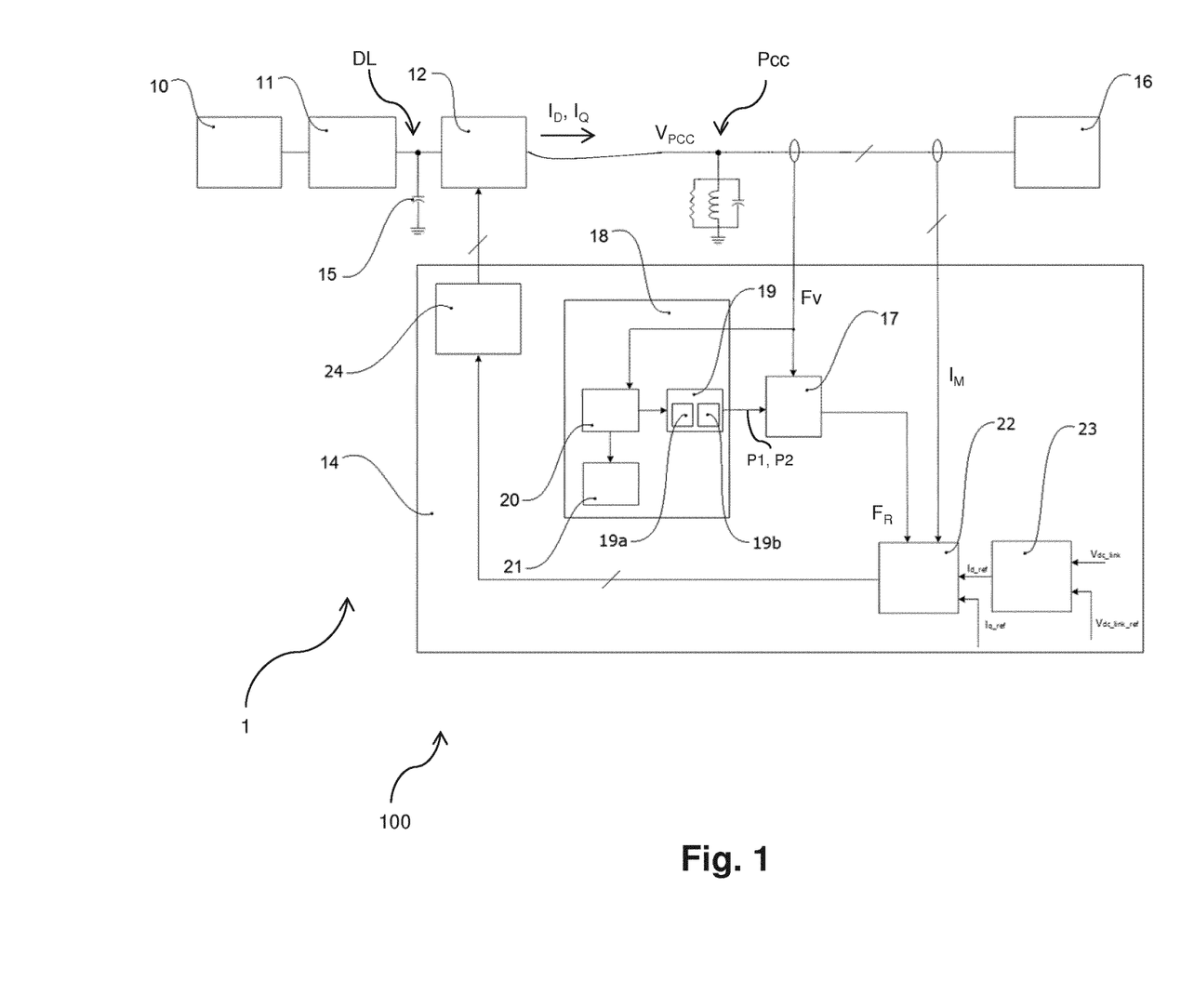
FIG. 1 shows a block diagram of a grid connectable DC/AC converter apparatus provided with a controller module implementing the method, according to the present invention.

FIG. 1 shows a generic block diagram of a grid connected single-phase or multi-phase DC/AC converter apparatus.

The DC/AC converter apparatus 1 has an input electrically connected to a respective electric power generation apparatus 10, e.g. a photovoltaic generation plant or a wind generation plant.

The output of the DC/AC converter apparatus 1 is electrically connected to a main grid 16 (e.g. a power utility grid) at a point of common coupling Pcc.

Both the DC/AC converter apparatus 1 and the electric power generation apparatus 10 are part of an electric power generation apparatus 100, which may include further DC/AC converter apparatus electrically connected to the main grid 16 at the point of common coupling Pcc.

The DC/AC converter apparatus 1 comprises an input DC/DC converter 11 and a cascaded DC/AC inverter 12.

The input DC/DC converter 11 is adapted to boost the DC voltage provided by the energy generation apparatus 10 to a predetermined DC voltage level to charge a capacitor bank 15 at a DC-Link output terminal DL.

The DC/AC inverter 12, which operates as an AC current generator, is adapted to convert the DC voltage at the DC-Link terminal DL into an AC voltage synchronized with the main grid 16.

The DC/AC converter apparatus 1 comprises a control unit 14 adapted to control the operation of said DC/AC converter apparatus.

In order to carry out its functionalities, the control unit 14 comprises data processing resources that may be industrially implemented in an analog and/or digital manner.

If they are implemented in analog manner, said data processing resources comprise one or more electronic circuits suitably arranged to perform the functionalities provided for said data processing resources.

If they are implemented in a digital manner, said data processing resources comprise one or more computerized units (e.g. DSPs or microprocessors) and suitably arranged sets of software instructions stored in a medium and executable by said computerized units to perform the functionalities provided for said data processing resources.

The present invention will be now described in more details with reference to embodiments, in which the data processing resources of the control unit 14 are implemented in a digital manner. In order to carry out its control functionalities, the control unit 14 comprises data processing modules 17, 18, 19, 20, 21, 22, 23, 24, each of which is preferably formed by suitably arranged sets of software instructions stored in a medium and executable by the computerized units of the control unit 14.

The control unit 14 comprises an inner current control loop adapted to control the current provided in output by the DC/AC inverter 12 (which normally operates as a current generator), in particular to regulate the active current ID and the reactive current IQ provided in output by the said DC/AC inverter to the reference values $I_{D\_ref}$ and $I_{Q\_ref}$.

Said inner current control loop comprises a current controller 22 and a PWM modulator 24. The current controller 22 is configured to receive reference signals $I_{D\_ref}$ and $I_{Q\_ref}$ indicative of the reference amplitude for the active current $I_D$ and the reactive current $I_Q$ to be provided in output, a reference signal $F_R$ indicative of the reference frequency for the active current $I_D$ and the reactive current $I_Q$ to be provided in output and a measurement signal $I_M$ indicative of the actual active current $I_D$ and the reactive current $I_Q$ (measured by a suitably current sensor of known type).

The PWM modulator 24 is adapted to receive control signals from the current controller 22 and provide control signals for the switches of the DC/AC inverter 12.

The control unit 14 preferably comprises also an outer voltage control loop adapted to regulate the power flow balancing within the DC/AC converter apparatus.

Said outer voltage loop preferably comprises a voltage controller 23, which is configured to receive a reference signal $V_{dc\_link\_ref}$ indicative of the reference amplitude for the DC voltage at the DC-Link terminal DL and a measurement signal $V_{dc\_link}$ indicative of the actual amplitude of the DC voltage at the DC-Link terminal DL (measured by a suitably current sensor of known type).

The voltage controller 23 provides in output the reference signals $I_{D\_ref}$ and $I_{Q\_ref}$ which are received in input by the current controller 22. In this way, the control action carried out by the voltage controller 23 influences the inner current control loop.

In order to perform islanding detection functionalities, the control unit 14 comprises a frequency tracking module 17 adapted to track the grid frequency of the AC voltage provided in output by the DC/AC converter apparatus.

Preferably, the tracking module 17 is a phase locked loop (PLL) 17.

The tracking module 17 receives a reference signal Fv indicative of the AC voltage $V_{PCC}$ at the point of common coupling $P_{CC}$ and provides in output a tracking signal $F_R$, which forms the frequency reference signal received by the current controller 22.

Conveniently, the control unit 14 comprises an anti-islanding module 18, which, among other functionalities, it is adapted to provide a frequency perturbation to the reference signal Fv received by the tracking module 17.

Thanks to the mentioned modules 17, 18, the control unit 14 can implement methods to detect the presence of islanding conditions, which are based on the introduction of frequency perturbations in the reference signal Fv received by the tracking module 17 to modify the waveform of the tracking signal $F_R$ provided in output by said tracking module.

Figure 3:
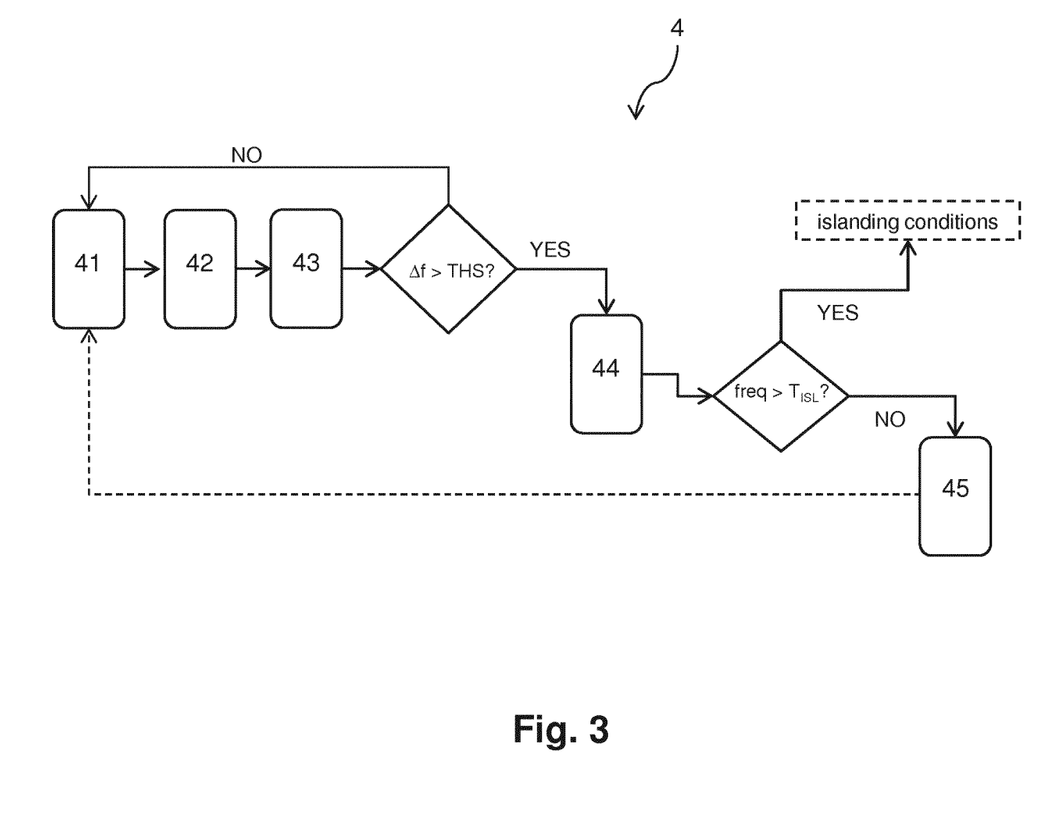

The enclosed FIG. 3 shows the waveform of the tracking signal $F_R$ provided in output by the tracking module 17.

When the reference signal Fv, which is received by the tracking module 17, is subject to a frequency perturbation, the tracking signal $F_R$, which is provided in output by the tracking module 17, is subject to a distortion so that the new signal zero crossing point falls before or after the detected zero crossing point, while the period of the waveform is left unaltered.

As a consequence of the control action carried out by the current controller 22, the waveform of the current provided in output by the DC/AC inverter 12 will be distorted accordingly.

In FIG. 3, the distorted waveform of the tracking signal $F_R$ of the tracking module 17 (PLL) shows a higher frequency with respect to the actual grid frequency picked up at the point of point of common coupling Pcc.

The distorted waveform ends each half-cycle remaining at zero amplitude for the time $t_z$ before starting the next half-cycle.

Similar considerations would apply in case the chosen frequency perturbation of the tracking signal $F_R$ is such that to force the frequency to be lower than the nominal one.

In this case, the distorted waveform would have a lower frequency than the frequency. detected at the point of common coupling Pcc.

When it is electrically connected with the DC/AC converter apparatus at the point of common coupling Pcc, the main grid 16 opposes any change in the voltage frequency.

If the DC/AC inverter 12 tries to change the frequency of its output current, the main grid 16 keeps on providing a solid phase and frequency reference to the tracking module 17 thus stabilizing the operating point at the frequency of the grid voltage and no positive feedback involving the tracking module 17 will occur.

Instead, in islanding conditions, the frequency of the AC voltage $V_{PCC}$ at the point of common coupling Pcc will change due to the frequency perturbation injected by the DC/AC inverter 12. The AC voltage $V_{PCC}$ will then follow the injected distorted current waveform and cross the zero amplitude axis in a time ($T_{PCC}/2-tz$), which is different from nominal half-cycle $T_{PCC}/2$.

This applies also to the next half-cycle and the point of zero crossing of the AC voltage $V_{PCC}$ shifts accordingly.

The frequency of the tracking signal $F_R$ will shift as well in order to remain synchronized with the new detected voltage frequency and therefore the frequency perturbation at the next AC cycle is applied on the reference signal Fv with altered frequency, thus producing a positive feedback.

As a result, the AC voltage $V_{PCC}$ is subject to a frequency drift, the detection of which can be used to identify ongoing islanding conditions.

Figure 2:
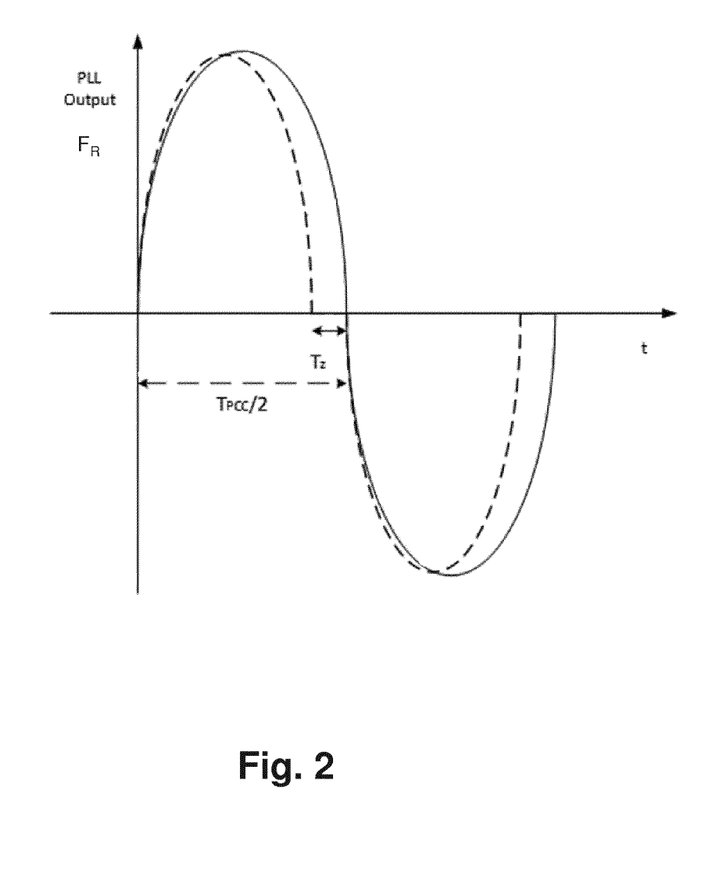
FIGS. 2-7 show block diagrams describing the method for detecting an islanding condition, according to the present invention.

With reference to the enclosed FIGS. 1 and 2, the anti-islanding module 18 preferably comprises a signal injector module 19, which is operatively associated with the tracking module 17.

Preferably, the signal injector module 19 comprises a module 19a for generating a frequency perturbation for the reference signal Fv and a module 19b for providing a frequency perturbation to said reference signal.

Preferably, the anti-islanding module 18 further comprises a frequency extractor module 20, operatively associated with the signal injector module 19.

The frequency extractor module 20 is adapted to periodically (at each AC cycle) measure the frequency of the AC voltage $V_{PCC}$ at the point of common coupling Pcc.

The frequency extractor module 20 is also adapted to detect any change $\Delta f$ in the frequency of the AC voltage $V_{PCC}$, where $\Delta f = F_N - F_0$, $F_N$ being the frequency measurement at a time N, $F_0$ being an average grid frequency that may be calculated as indicated in the following.

The anti-islanding module 18 preferably comprises also an islanding detector module 21, operatively associated to said signal injector module 19.

The islanding detector module 21 is adapted to identify possible islanding conditions, based on the information provided by the frequency extractor module 20, generate an alarm signal if islanding conditions are identified and change the operation of the DC/AC converter apparatus in case of islanding conditions (e.g. by switching off said apparatus).

The method 1 according to the invention and its practical implementation by the control unit 14 is now described in more details.

The method 1 comprises a step 41 of providing a first weaker frequency perturbation P1 to an input reference signal Fv in order to shift the frequency of the AC voltage $V_{PCC}$ at the point of common coupling Pcc.

Conveniently, the first frequency perturbation is generated and applied by the signal injector module 19 and it affects the reference signal Fv in input to the tracking module 17.

Figure 4:
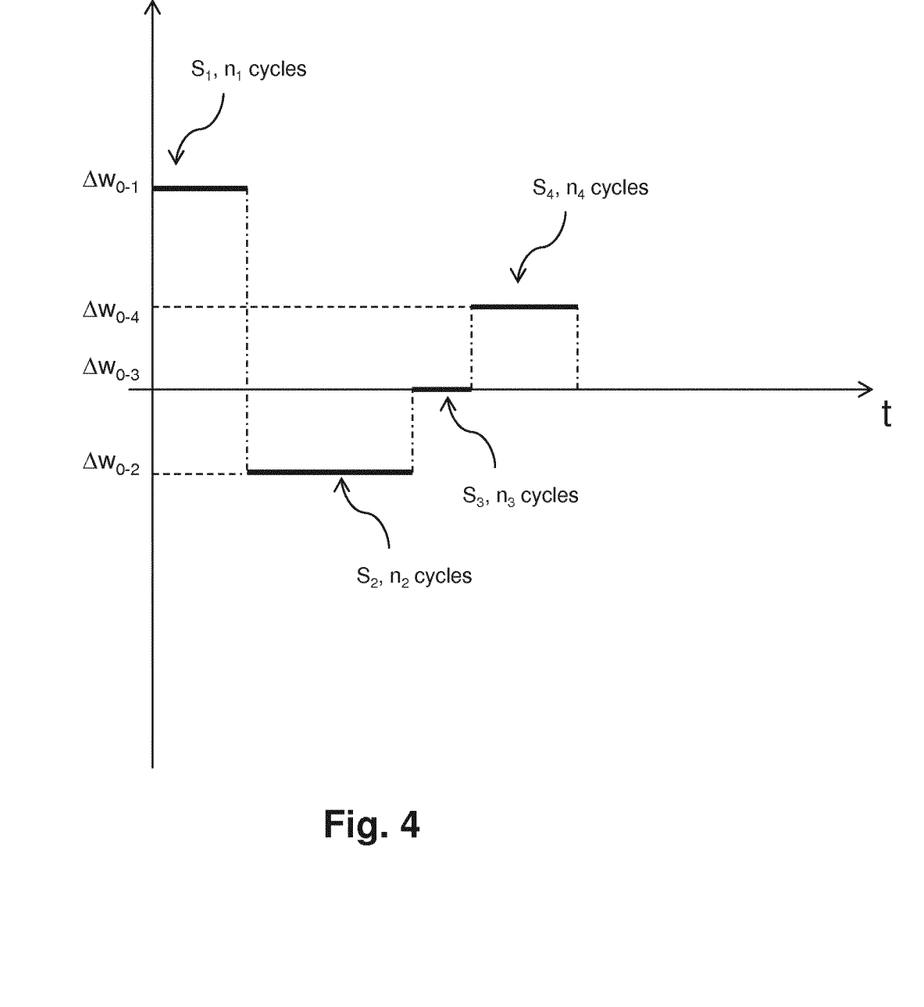

According to the invention, the first frequency perturbation has a first frequency perturbation value $\Delta\omega_{0-1}$ and is repeatable for a series $S_1$ of AC cycles, which includes a corresponding variable number $n_1$ of AC cycles (FIG. 4).

In practice, according to the invention, said first weaker frequency perturbation P1 has a first frequency perturbation value $\Delta\omega_{0-1}$ and have a duration (the number $n_1$ of AC cycles) that is variable from time to time (i.e. for each series of AC cycles).

According to some embodiments, the number $n_1$ of AC cycles is randomly calculated by the signal injector module 19, for example by means of random number generator.

According to other embodiments, the number $n_1$ of AC cycles is randomly selected by the signal injector module 19 from a set of predefined numbers.

According to an embodiment, the number $n_1$ of AC cycles is selected by the signal injector module 19 from a set of predefined number according to a given selection order, principle or method.

Preferably, when a first frequency perturbation P1 (having a first frequency perturbation value $\Delta\omega_{0-1}$) has been repeated for a series $S_1$ of AC cycles including a given number $n_1$ of AC cycles, a new first frequency perturbation P1 is generated.

Such a new first frequency perturbation P1 as a new first frequency perturbation value $\Delta\omega_{0-2}$ and is repeatable for a new series $S_2$ of AC cycles having a new number $n_2$ of AC cycles. Such a new number $n_2$ of AC cycles may be varied with respect to the previous number $n_1$ of AC cycles corresponding to the series $S_1$.

As it may be easily understood from the above, the method 1 provides for generating subsequent first frequency perturbations P1 with first frequency perturbation values that may be different in module and sign and, above all, with time durations that are variable from time to time. The inventors have found that this solution provides surprising effects in terms of detection efficiency as it induces a fast drift of the frequency of the AC voltage $V_{PCC}$ (if islanding conditions are present), even when a plurality of DC/AC converter apparatus are electrically connected in parallel to a same main grid 16 at a same point of common coupling Pcc.

As is known, multiple DC/AC converter apparatuses sharing a same main grid 16 might have different loads or different points of operation and input power.

As a result, said DC/AC converter apparatuses might react differently to the same frequency perturbation possibly reducing or delaying the frequency drift of the AC voltage $V_{PCC}$ even if islanding conditions are present.

In traditional solutions of the state of the art, these compensation effects among multiple DC/AC converter apparatuses may lead to an incorrect or delayed identification of islanding conditions.

Instead, the described solution is quite efficient in causing a frequency drift of the AC voltage $V_{PCC}$ (if islanding conditions are present) as first frequency perturbations are not periodically repeated as it occurs in a detection method proposed by EP3079217A1 but instead can vary in magnitude and duration at each repetition cycle.

This feature allows efficiently detecting the presence of islanding conditions by remarkably reducing or avoiding the possibility of the undesired compensation effects described above.

As a result, possible NDZs for the DC/AC converter apparatus 1 are drastically narrowed and the time required to detect possible islanding conditions is remarkably reduced (even 2-3 time shorter with respect to traditional solutions), which is a very important factor in plants including multiple DC/AC converter apparatuses electrically connected to a same main grid 16.

This makes the DC/AC converter apparatus 1 adapted to pass the most severe certification tests in terms of anti-islanding safety.

As an additional advantage, it is possible to lower the magnitude of the first weaker frequency perturbation values (which may be of few mHz) with consequent improvement the power quality, e.g. of the THD and cos φ parameters of the DC/AC converter apparatus 1.

According to some embodiments of the invention, as shown in FIG. 4, each first perturbation provided to the reference signal Fv has a different first frequency perturbation value $\Delta\omega_{0-1}$, $\Delta\omega_{0-2}$, $\Delta\omega_{0-3}$, $\Delta\omega_{0-4}$, . . . .

As shown in FIG. 4, the first frequency perturbations may even have a first frequency perturbation value that is equal to zero ($\Delta\omega_{0-3}=0$).

According to some embodiments of the invention, the first frequency perturbations have first frequency perturbation values $\Delta\omega_{0-1}$, $\Delta\omega_{0-2}$ $\Delta\omega_{0-3}$, $\Delta\omega_{0-4}$, . . . that are randomly calculated or randomly selected each time.

According to some embodiments of the invention, the first frequency perturbation values $\Delta\omega_{0-1}$, $\Delta\omega_{0-2}$ $\Delta\omega_{0-3}$, $\Delta\omega_{0-4}$, . . . are instead predefined and first by uploading them from a reference table stored in a memory for each first frequency perturbation.

Figure 6:
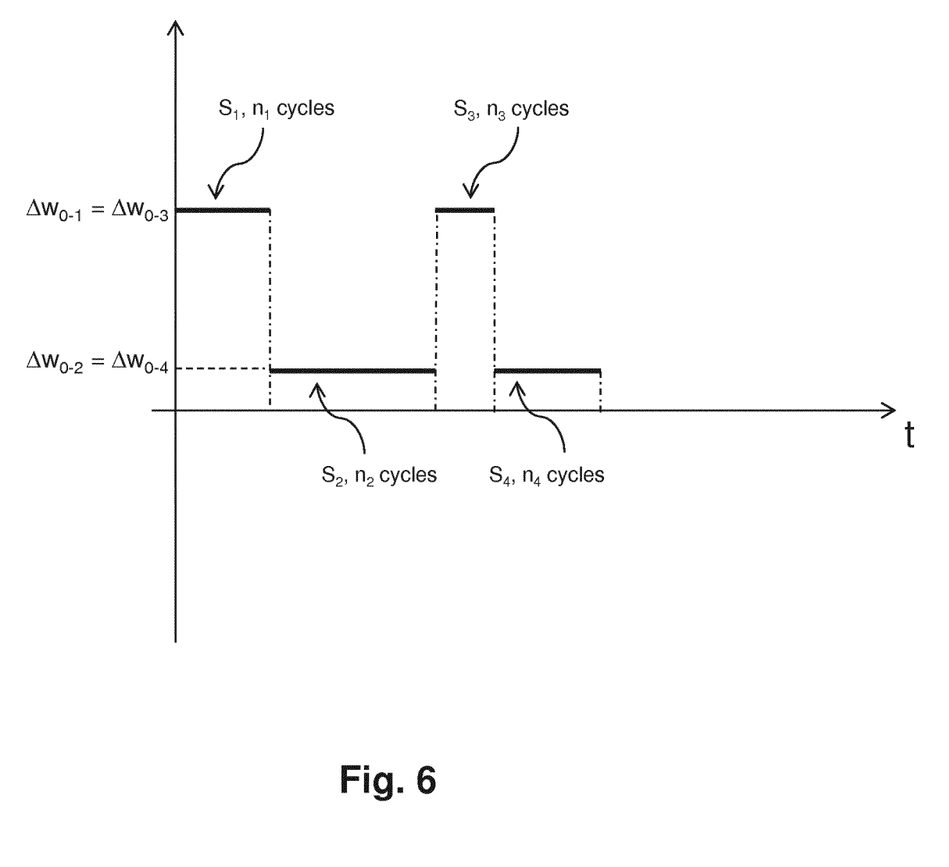
Figure 7:
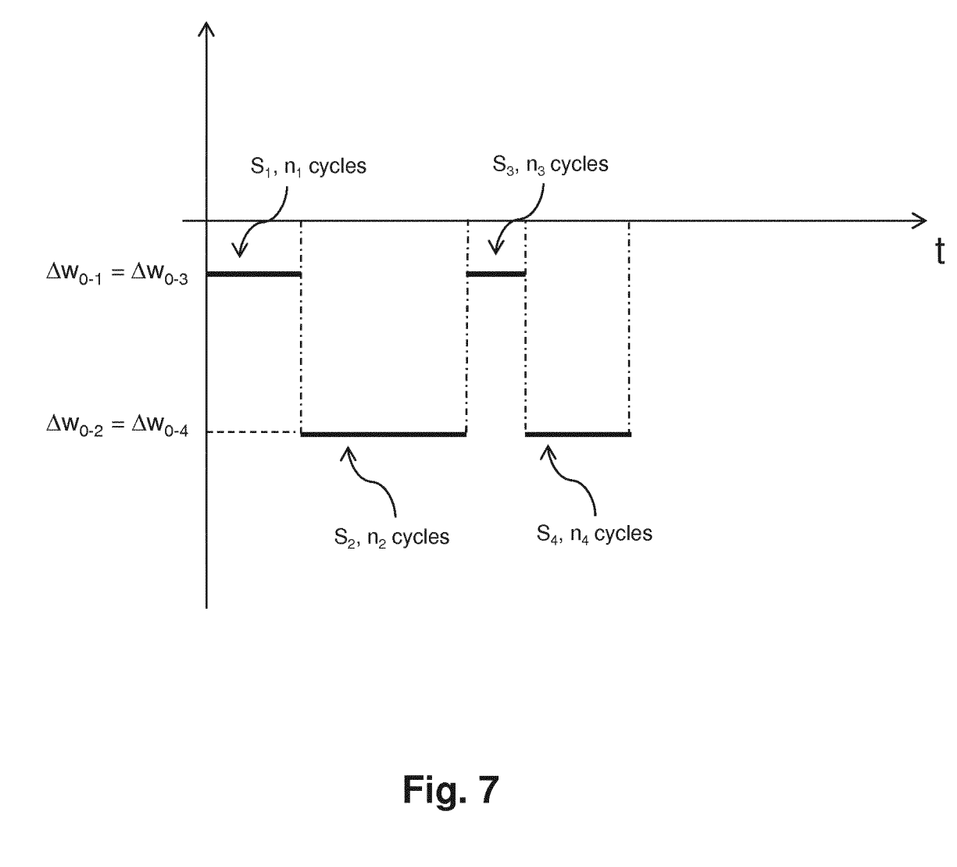

According to some embodiments of the invention, as shown in FIGS. 6-7, the sign of the first frequency perturbation value $\Delta\omega_{0-1}$, $\Delta\omega_{0-2}$, $\Delta\omega_{0-3}$, $\Delta\omega_{0-4}$, . . . is maintained constant (positive or negative) at each first frequency perturbation.

Figure 5:
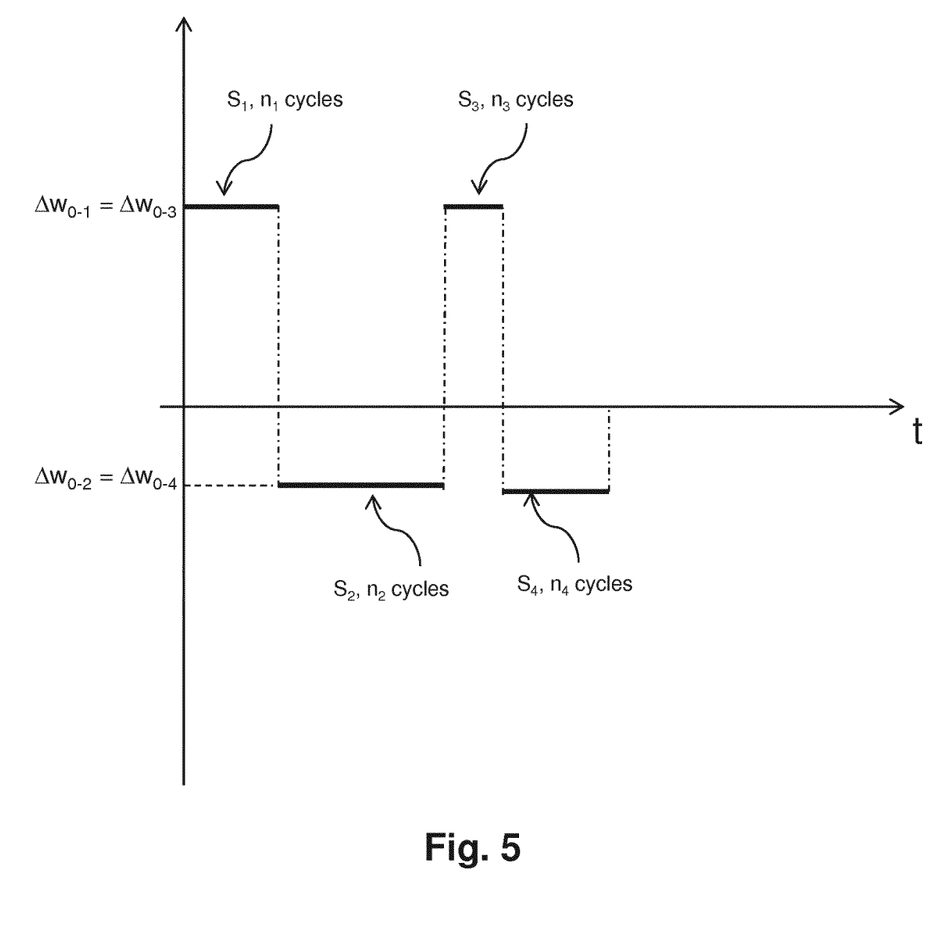

According to some embodiments of the invention, as shown in FIGS. 5-7, frequency perturbations having an even generation index (i.e. generated as second, fourth, . . . and so on) have a first constant first frequency perturbation value $\Delta\omega_{0-2}=\Delta\omega_{0-4}$.

According to some embodiments of the invention, as shown in FIGS. 5-7, frequency perturbations having an odd generation index (i.e. generated as first, third, . . . and so on) have a first constant first frequency perturbation value $\Delta\omega_{0-1}=\Delta\omega_{0-3}$.

The method 1 comprises a step 42 of frequency tracking the reference signal Fv including a frequency perturbation.

Conveniently, the tracking of the perturbed reference signal Fv is carried out at each AC cycle by the tracking module 17, which provides in output a perturbed tracking signal $F_R$ that, in turn, affects the current control loop of the control unit 14.

The current control loop of the control unit 14 drives the AC/DC inverter 12 to provide in output a current having an output frequency $\omega_0+\Delta\omega_{0-1}$, wherein $\omega_0$ is the tracked frequency (expressed in terms of pulsation) and $\Delta\omega_{0-1}$ is the first frequency perturbation value of the applied frequency perturbation.

As illustrated above, in normal operation with the DC/AC converter apparatus 1 electrically connected to the main grid 16, any frequency drift of the AC voltage $V_{PCC}$ at the point of common coupling Pcc is opposed by the main grid 16.

Thus, even if the AC/DC inverter 12 injects a current having a drifted output frequency $\omega_0+\Delta\omega_0$, the main grid 16 will maintain constant the frequency of the AC voltage $V_{PCC}$ at the nominal grid frequency. In this way, no positive feedback (induced by the anti-islanding module 18 and tracking module 17) occurs in the current control loop of the control unit 14.

Instead, if islanding conditions are present, the frequency of the AC voltage $V_{PCC}$ will change due to the current injected by the AC/DC inverter 12. As mentioned above, a positive feedback will occur in the current control loop of the control unit 14.

In view of the considerations above, the method 1 comprises the step 43 of measuring the frequency of the AC voltage $V_{PCC}$ at the point of common coupling Pcc.

Conveniently, said frequency measurement is carried out at each AC cycle by the frequency extractor module 20.

Preferably, said frequency measurement is implemented through an AC voltage zero crossing detection and the following measurement of the time interval between two consecutive wave-fronts having a same slope (positive or negative).

To make the measurement more accurate and evaluate the trend of the frequency of the AC voltage $V_{PCC}$ at the point of common coupling Pcc, the frequency extractor module 20 preferably calculates the short moving average of a small number of frequency samples $F_N$, for instance a number smaller than 10 samples, and the long moving average of a large number of frequency samples $F_N$, for instance a number larger than 50 samples, respectively.

The short moving average of a small number of the last frequency samples $F_N$, is suitable to filter the frequency measurements $F_N$ from noise, EMI and, in general, from inaccuracies in the frequency measurement.

The long moving average of a large number of last samples is suitable to sense the actual trend of the frequency measurement in order to speed up the detection of an islanding condition and the managing of the detected alarm.

Conveniently, the frequency extractor module 20 provides the calculated values to the signal injector module 19.

If no change or, better, no appreciable change $\Delta f$ in frequency (frequency drift) of the AC voltage $V_{PCC}$ is detected, i.e. if the frequency drift $\Delta f$ is lower than a start threshold value THS ($\Delta f$>THS, where THS is a tunable value that may be equal to some tens of mHz), the previous steps of method 1 are repeated from the beginning for the next AC cycle.

In this case, a first weaker perturbation P1 is applied also for the next AC cycle.

Such a further first frequency perturbation is identical to the previous frequency perturbation applied at the previous AC cycle, if the repetition series of said previous frequency perturbation is not over.

Otherwise, such a further first frequency perturbation is different from the previous frequency perturbation applied at the previous AC cycle, if the repetition series of said previous frequency perturbation is over and the further first frequency perturbation is generated ex-novo.

If an appreciable change $\Delta f$ in frequency of the AC voltage $V_{PCC}$ is instead detected, i.e. if the frequency drift $\Delta f$ is higher than the start threshold value THS ($\Delta f$>THS, the method 1 comprises the step 44 of comparing the measured frequency of the AC voltage $V_{PCC}$ with a first threshold value $T_{ISL}$ (e.g. of few Hz over a nominal grid frequency).

Such a comparison is conveniently carried out by the islanding detector module 21.

If the frequency of the AC voltage $V_{PCC}$ is higher than a first predetermined threshold value $T_{ISL}$ for a given number of AC cycles, islanding conditions are identified.

In this case, conveniently, the islanding detector module 21 generates an alarm signal and, for instance, intervenes to switch off the DC/AC converter apparatus 1 in order to interrupt the output flow of electric power from this latter and ensure safety for possible maintenance interventions.

If the frequency change of the AC voltage $V_{PCC}$ is lower than the first threshold value $T_{ISL}$, this means islanding conditions are likely to be present but are not clearly identified yet.

In practice, the method has identified a certain frequency drift $\Delta f$, which cannot be attributed with certainty to the presence of islanding conditions yet.

In this case, the method 1 provides for a series of steps (reference 45) aimed at providing second stronger frequency perturbations to the reference signal Fv in order to induce a possible frequency drift of the AC voltage $V_{PCC}$.

In particular, the method 1 comprises the step of selecting a constant frequency perturbation value $\Delta\omega_0$.

According to some embodiments, the constant frequency perturbation value $\Delta\omega 0$ is selected (e.g. by the signal injector module 19) equal to the last first frequency perturbation value $\Delta\omega_{0-1}$, $\Delta\omega_{0-2}$, $\Delta\omega_{0-3}$, $\Delta\omega_{0-4}$, ... used in the last series of AC cycles to provide a first perturbation to the reference signal Fv before the frequency drift $\Delta f$ was found higher than the start threshold value THS.

According to other embodiments, the constant frequency perturbation value $\Delta\omega_0$ (and its sign) may be selected or calculated (e.g. by the signal injector module 19) in an adaptive way, e.g. depending on the behavior of a measured average frequency.

The method 1 then comprises the step of calculating an additional frequency perturbation value $\Delta\omega_0$.

The additional frequency perturbation value $\Delta\omega$ is calculated (e.g. by the signal injector module 19) based on the trend of the frequency measurements performed by said frequency extractor module 20.

Preferably, the additional frequency perturbation value $\Delta\omega$ is calculated as follows:

$\Delta\omega = k\Delta F_L$ wherein k can be a constant value or an adaptive value, $k=f(\Delta F_L)$, and $\Delta F_L = F_N - F_{AVGL}$, $F_N$ being the frequency measurement at the time N and $F_{AVGL}$ being the moving average of the last large number of frequency measurements $F_N$, said large number being, for instance, larger than 50.

Preferably, the parameter k described above is chosen in a group comprising: a first value k1 to be initially applied, and a second value k2, higher than the first value k1, to be subsequently applied in order to make the detection of the islanding condition faster.

In higher details, the parameter k is preferably selected as follows:
- if $\Delta F_L$ is lower than a second threshold value $T_{K1}$ ($\Delta F_L < T_{K1}$ or $\Delta F_L > -T_{K1}$), then $k=k0$ (e.g. $k=0$);
- if $\Delta F_L$ is higher than said second threshold value $T_{K1}$ ($\Delta F_L > T_{K1}$ or $\Delta F_L < -T_{K1}$), then $k=k1$ with $k1>k0$;
- if $\Delta F_L > T_{K1}$ (or $\Delta F_L < -T_{K1}$) constantly within a predetermined time interval and $\Delta F_L$ is higher than the third threshold value $T_{K2}$ ($\Delta F_L > T_{K2}$ or $\Delta F_L < -T_{K2}$), then $k=k2$ with $k2>k1$.

It is observed that the second and third threshold values $T_{K1}$, $T_{K2}$ are conceptually quite different from the above mentioned first threshold value $T_{ISL}$.

The second and third threshold values $T_{K1}$, $T_{K2}$ refer to given frequency ranges to take as references to select the parameter k whereas the first threshold value $T_{ISL}$ refers to an absolute frequency value taken as a reference to determine whether islanding conditions are present.

Also from a numerical point of view, the second and third threshold values $T_{K1}$, $T_{K2}$ are quite lower (e.g. some tenth of Hz) with respect to the first threshold value $T_{ISL}$ mentioned above. Preferably, the additional frequency perturbation value $\Delta\omega$ is not applied if $F_{AVGS} < F_{MAX}$ or $F_{AVGS} > F_{MIN}$ wherein $F_{AVGS}$ is the moving average of the last small number of frequency measurements $F_N$ (said small number being, for instance, equal to 8), $F_{MAX}$, $F_{MIN}$ are the maximum and minimum acceptable values for the frequency of the AC voltage $V_{PCC}$, respectively. In this case, the parameter k can be lowered, e.g. it can be set as null ($k=0$).

The method 1 comprises the step of calculating a second frequency perturbation value $\Delta\omega_0 + \Delta\omega$ by adding the additional frequency perturbation value $\Delta\omega$ to the selected constant frequency perturbation value $\Delta\omega_0$.

Then, the method 1 comprises the step of providing a second stronger frequency perturbation P2 to said input reference signal Fv, said second frequency perturbation having the second frequency perturbation value $\Delta\omega_0 + \Delta\omega$ previously calculated.

The steps 42-44 of the method 1 are then repeated.

The reference signal Fv including the second stronger frequency perturbation P2 is tracked by the tracking module 17, which provides in output a perturbed tracking signal $F_R$ that, in turn, affects the current control loop of the control unit 14.

The current control loop of the control unit 14 drives the AC/DC inverter 12 to provide in output a current having an output frequency $\omega_0 + \Delta\omega_0 + \Delta\omega$, herein $\omega_0$ is the tracked frequency, $\Delta\omega_0$ is the constant frequency perturbation value, $\Delta\omega$ is the additional frequency perturbation value. The frequency extractor module 20 measures the frequency of the AC voltage $V_{PCC}$ at the point of common coupling Pcc.

If no change $\Delta f$ in the frequency of the AC voltage $V_{PCC}$ is detected, the steps 41-45 of method 1 are repeated from the beginning.

In this case, a first weaker perturbation P1 (generated as described above) is again applied for the next AC cycle and the following steps 42-45 are then executed.

If a frequency drift of the AC voltage $V_{PCC}$ is detected, the islanding detector module 21 compares the frequency of the AC voltage $V_{PCC}$ with the threshold value $T_{ISL}$.

If it identifies islanding conditions, the islanding detector module 21 generates an alarm signal and, for instance, intervenes to switch off the DC/AC converter apparatus 1.

If islanding conditions are not identified by the islanding detector module 21, the previous series of steps 45 may be conveniently repeated.

In this case, a new additional frequency perturbation value $\Delta\omega'$ may be conveniently calculated by using a term k selected basing on the conditions described above.

For example, a term $k=k2>k1$ may be selected or a term $k=k1$ may be maintained constant or, in particular conditions (as mentioned above) a term $k=0$ may be selected.

A new second stronger frequency perturbation is provided in input to the reference signal Fv, where said further frequency perturbation has said new second frequency perturbation value $\Delta\omega_0 + \Delta\omega'$.

The reference signal Fv including the new second frequency perturbation is tracked by the tracking module 17, which provides in output a perturbed tracking signal $F_R$ that, in turn, affects the current control loop of the control unit 14.

The current control loop of the control unit 14 drives the AC/DC inverter 12 to provide in output a current having a output frequency $\omega_0 + \Delta\omega_0 + \Delta\omega'$, herein $\omega_0$ is the tracked frequency, $\Delta\omega_0$ is the constant frequency perturbation value, $\Delta\omega'$ is the additional frequency perturbation value.

The frequency extractor module 20 then measures the frequency of the AC voltage $V_{PCC}$ at the point of common coupling Pcc.

If no change $\Delta f$ in the frequency of the AC voltage $V_{PCC}$ is detected, the previous steps 41-45 of method 1 are repeated from the beginning for the next AC cycle.

In this case, a first weaker perturbation P1 (generated as described above) is again applied for the next AC cycle and the following steps 42-45 are then executed.

If a frequency drift of the AC voltage $V_{PCC}$ is detected, the islanding detector module 21 compares the frequency of the AC voltage $V_{PCC}$ with the threshold value $T_{ISL}$.

If it identifies islanding conditions, the islanding detector module 21 generates an alarm signal and, for example, intervenes to switch off the DC/AC converter apparatus 1.

If islanding conditions are not identified by the islanding detector module 21, the previous series of steps 45 may be conveniently repeated.

However, if it is observed that the quantity $\Delta F_L = F_N - F_{AVGL}$ is converging to zero the previous steps 41-45 of the method 1 is conveniently repeated from the beginning.

In this case, a first weaker perturbation P1 (generated as described above) is again applied for the next AC cycle and the following steps 42-45 are then executed.

The method 1 for detecting islanding conditions according to the present invention provides several advantages with respect to the state of the art.

As illustrated above, the method 1 provides top level performances in terms of reliability and efficiency in the identification of possible islanding conditions and in terms of power quality, particularly when multiple DC/AC converter share a same main grid at the point of common coupling Pcc.

The method 1 further provides a high immunity to grid frequency variations as in these cases the intervention of the anti-islanding module 18 and of the tracking module 17 would not automatically cause a positive feedback phenomena in the current control loop.

The method 1 is of relatively easy implementation at industrial level. As an example, the step of the method according to the invention can be easily carry out by processing devices on board the DC/AC converter apparatus 1, such as μcontroller or a DSP included in the control unit 14 to control the operation of the DC/AC converter apparatus 1.

The invention claimed is:

1. A method for detecting islanding conditions for a DC/AC converter apparatus electrically connected with a main grid at a point of common coupling, the method comprises:
    providing a first frequency perturbation to a reference signal in order to try shifting the frequency of an AC voltage at said point of common coupling, said first frequency perturbation having a first frequency perturbation value and being repeatable for a corresponding series of AC cycles, each series of AC cycles having a corresponding variable number of AC cycles;
    frequency tracking said reference signal including a frequency perturbation;
    measuring the frequency of said AC voltage at said point of common coupling;
    If a change in frequency of said AC voltage lower than a start threshold value is detected repeating the previous steps;
    if a change in frequency of said AC voltage higher than said start threshold value is detected, comparing the frequency of said AC voltage at said point of common coupling with a first threshold value;
    if the frequency of said AC voltage at said point of common coupling is higher than said first threshold value, islanding conditions are identified;
    if the frequency of said AC voltage at said point of common coupling is lower than said first threshold value, executing the following steps:
        selecting a constant frequency perturbation value;
        calculating an additional frequency perturbation value;
        calculating a second frequency perturbation value by adding said additional frequency perturbation value to the constant frequency perturbation value;
        providing a second frequency perturbation to said input reference signal, said second frequency perturbation having said further frequency perturbation value.

2. The method, according to claim 1, wherein each series of AC cycles has a corresponding variable number of AC cycles that is randomly calculated or randomly selected from a set of predefined numbers or selected from a set of predefined numbers according to a given selection order or principle method.

3. The method, according to claim 1, wherein when a first frequency perturbation has been repeated for a given series of AC cycles, a new first frequency perturbation is generated, said new first frequency perturbation having a new first frequency perturbation value and being repeatable for a new series of AC cycles having a new varied number of AC cycles.

4. The method, according to claim 1, wherein said first frequency perturbation value is predefined or randomly calculated or randomly selected for each first perturbation.

5. The method, according to claim 1, wherein first frequency perturbations with an even generation index have a same constant first frequency perturbation value.

6. The method, according to claim 1, wherein first frequency perturbations with an odd generation index have a same constant first frequency perturbation value.

7. The method, according to claim 1, wherein the sign of said first frequency perturbation value is maintained constant for each first frequency perturbation.

8. The method, according to claim 1, wherein each first frequency perturbations has a different first frequency perturbation value.

9. The method, according to claim 1, wherein said additional frequency perturbation value is such that $\Delta\omega = k\Delta F_L$ wherein: $\Delta F_L = F_N - F_{AVGL}$, $F_N$ is a frequency measurement sampled at a time N, $F_{AVGL}$ is a long moving average of said frequency samples $F_N$, k is a constant value or an adaptive value $k = f(\Delta F_L)$.

10. The method according to claim 9, wherein said parameter k is chosen in a group comprising at least a first value and a second value, higher than said first value.

11. The method, according to claim 1, wherein said constant frequency perturbation value is equal to the last used first frequency perturbation value or is a selected adaptive value.

12. A DC/AC converter apparatus electrically connectable with a main grid at a point of common coupling, said DC/AC converter apparatus comprising:
    a control module to control the operation of said converter apparatus and comprising data processing resources configured to execute a set of instructions effective to:
        provide a first frequency perturbation to a reference signal in order to try shifting the frequency of an AC voltage at said point of common coupling, said first frequency perturbation having a first frequency perturbation value and being repeatable for a corresponding series of AC cycles, each series of AC cycles having a corresponding variable number of AC cycles,
        frequency track said reference signal including a frequency perturbation,
        measure the frequency of said AC voltage at said point of common coupling,
        if a change in frequency of said AC voltage lower than a start threshold value is detected, repeat the previous steps,
        if a change in frequency of said AC voltage higher than said start threshold value is detected, compare the frequency of said AC voltage at said point of common coupling with a first threshold value, if the frequency of said AC voltage at said point of common coupling is higher than said first threshold value, island conditions are identified,
if the frequency of said AC voltage at said point of common coupling is lower than said first threshold value, execute the following steps:
select a constant frequency perturbation value,
calculate an additional frequency perturbation value, and
calculate a second frequency perturbation value by adding said additional frequency perturbation value to the constant frequency perturbation value, and
provide a second frequency perturbation to said input reference signal, said second frequency perturbation having said further frequency perturbation value.

13. An electric power generation system electrically connectable with a main grid at a point of common coupling, said electric power generation system comprising:
an electric power generation apparatus for producing DC electric power and including a DC/AC converter apparatus electrically connected between said electric power generation apparatus and said point of common coupling, the DC/AC converter apparatus being configured to:
provide a first frequency perturbation to a reference signal in order to try shifting the frequency of an AC voltage at said point of common coupling, said first frequency perturbation having a first frequency perturbation value and being repeatable for a corresponding series of AC cycles, each series of AC cycles having a corresponding variable number of AC cycles,
frequency track said reference signal including a frequency perturbation,
measure the frequency of said AC voltage at said point of common coupling,
if a change in frequency of said AC voltage lower than a start threshold value is detected, repeat the previous steps,
if a change in frequency of said AC voltage higher than said start threshold value is detected, compare the frequency of said AC voltage at said point of common coupling with a first threshold value,
if the frequency of said AC voltage at said point of common coupling is higher than said first threshold value, island conditions are identified,
if the frequency of said AC voltage at said point of common coupling is lower than said first threshold value, execute the following steps:
select a constant frequency perturbation value,
calculate an additional frequency perturbation value, and
calculate a second frequency perturbation value by adding said additional frequency perturbation value to the constant frequency perturbation value, and
provide a second frequency perturbation to said input reference signal, said second frequency perturbation having said further frequency perturbation value.

14. The method, according to claim 2, wherein when a first frequency perturbation has been repeated for a given series of AC cycles, a new first frequency perturbation is generated, said new first frequency perturbation having a new first frequency perturbation value and being repeatable for a new series of AC cycles having a new varied number of AC cycles.

15. The method, according to claim 10, wherein said constant frequency perturbation value is equal to the last used first frequency perturbation value or is a selected adaptive value.

16. The method, according to claim 2, wherein each first frequency perturbations has a different first frequency perturbation value.

17. The method, according to claim 2, wherein said first frequency perturbation value is predefined or randomly calculated or randomly selected for each first perturbation.

18. The method, according to claim 2, wherein first frequency perturbations with an even generation index have a same constant first frequency perturbation value.

19. The method, according to claim 2, wherein first frequency perturbations with an odd generation index have a same constant first frequency perturbation value.

20. The method, according to claim 2, wherein the sign of said first frequency perturbation value is maintained constant for each first frequency perturbation.

* * * * *